United States Patent [19]

den Hollander

[11] 4,220,898

[45] Sep. 2, 1980

[54] RASTER DISTORTION CORRECTION CIRCUIT

[75] Inventor: Willem den Hollander, Schlieren, Switzerland

[73] Assignee: RCA Corporation, New York, N.Y.

[21] Appl. No.: 949,672

[22] Filed: Oct. 10, 1978

[30] Foreign Application Priority Data

Nov. 25, 1977 [GB] United Kingdom ............... 49127/77

[51] Int. Cl.² ............................................. H01J 29/70
[52] U.S. Cl. .................................... 315/371; 315/393
[58] Field of Search ......................... 315/371, 393, 370

[56] References Cited

U.S. PATENT DOCUMENTS

| | | | |
|---|---|---|---|
| 2,304,057 | 12/1942 | Schade | 315/371 X |
| 2,951,180 | 8/1960 | Studebaker et al. | 315/370 |
| 3,946,274 | 3/1976 | Dietz | 315/371 |
| 3,946,274 | 3/1976 | Dietz | 315/371 |
| 3,962,602 | 6/1976 | Dietz | 315/371 X |
| 4,048,544 | 9/1977 | Haferl | 315/408 |
| 4,081,722 | 3/1978 | Haferl | 315/393 |
| 4,088,931 | 5/1978 | Haferl | 315/371 |
| 4,101,814 | 7/1978 | Haferl | 315/371 |

FOREIGN PATENT DOCUMENTS

1443038 7/1976 United Kingdom .

Primary Examiner—Malcolm F. Hubler
Attorney, Agent, or Firm—Eugene M. Whitacre; Paul J. Rasmussen; Joseph J. Laks

[57] ABSTRACT

A synchronous switched vertical deflection (SSVD) circuit is coupled by a flyback transformer to a horizontal deflection circuit. The SSVD circuit loads the horizontal deflection circuit at a vertical parabolic rate providing East-West pincushion correction. Because of the inductance of the vertical deflection winding, the parabolic loading is asymmetrical, producing a keystone-like raster distortion. A correction circuit, such as a constant current source coupled to the vertical deflection winding, substantially reduces the asymmetry of the loading thereby substantially reducing the keystone-like distortion.

6 Claims, 9 Drawing Figures

RASTER DISTORTION CORRECTION CIRCUIT

This invention relates to raster distortion correction circuits for picture display systems.

Many picture display systems use the principle of reaction scanning to produce a raster on a cathode ray tube screen. Horizontal and vertical deflection circuits develop sawtooth deflection currents in horizontal and vertical deflection windings.

Various types of raster distortions may exist and require correction. For example, East-West and North-South pincushion distortion is a result of the cathode ray tube having a relatively flat screen on which the raster is displayed and requires a generally parabolic correction to the peak deflection currents. Edge compression of the raster requires "S" shaping of the deflection currents. Inside pincushion distortion requires further appropriate modification to the deflection current waveforms.

For certain television receivers, the vertical deflection circuit is energized by power obtained from the horizontal deflection circuit. This vertical rate loading of the horizontal deflection circuit is approximately parabolic and provides some East-West correction to the picture tube. This type of loading may, however, be the source of another raster distortion which may require compensation.

SUMMARY OF THE INVENTION

A vertical deflection circuit includes a vertical deflection winding within which is developed a vertical scanning current. The vertical deflection circuit produces an asymmetrical vertical rate loading of the horizontal deflection circuit. A correction circuit coupled to the vertical deflection circuit produces a compensatory asymmetrical vertical rate loading for substantially reducing raster distortion caused by the first asymmetrical vertical rate loading.

DESCRIPTION OF THE INVENTION

Figure 1:
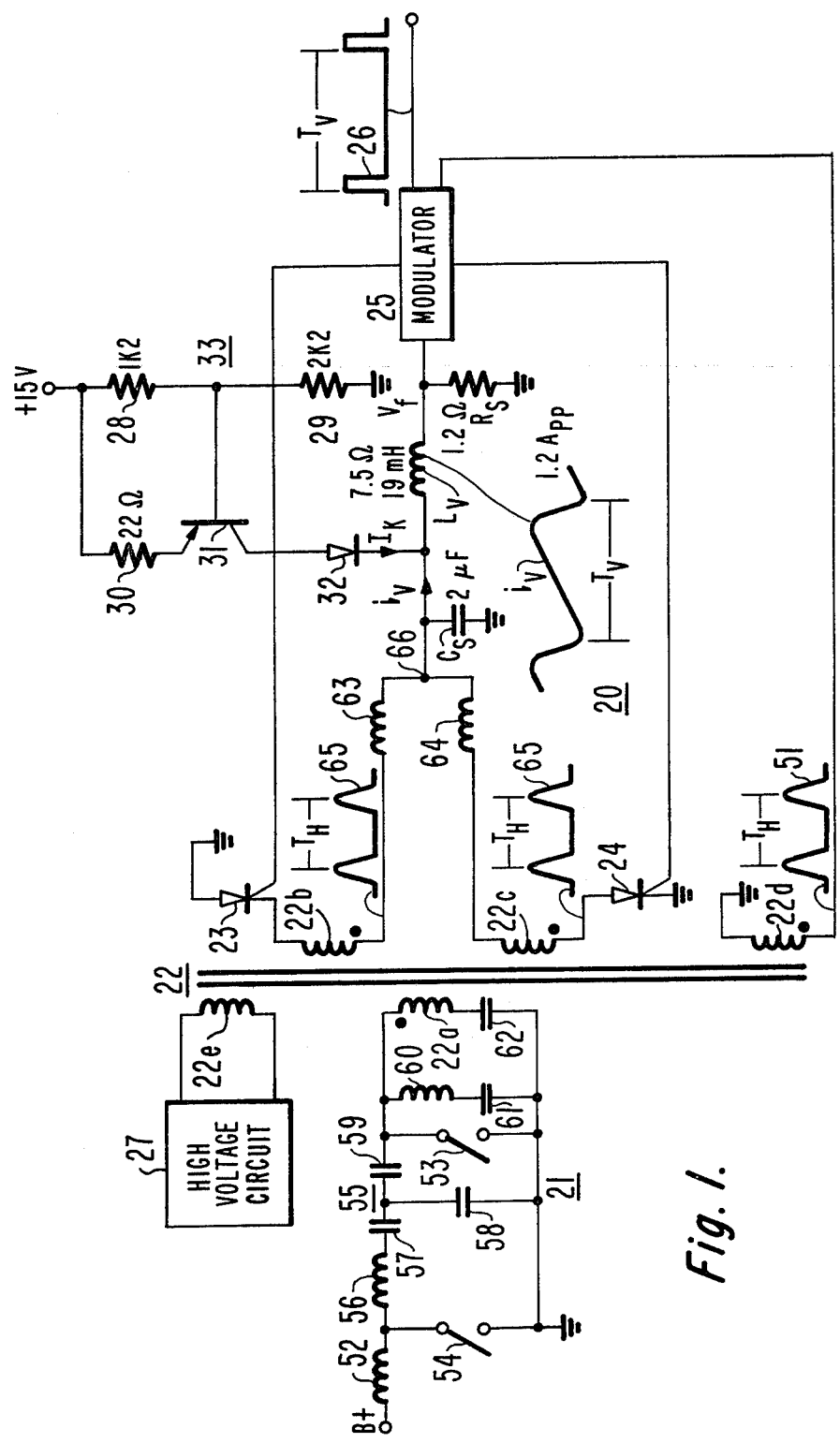
FIG. 1 illustrates deflection circuitry embodying the invention.

FIG. 1 illustrates a synchronous switched vertical deflection (SSVD) circuit 20 embodying the invention. The basic SSVD circuit 20 may be similar to that disclosed in U.S. Pat. No. 4,048,544 by P. E. Haferl entitled, "SWITCHED VERTICAL DEFLECTION SYSTEM." Horizontal rate energy 65 from a horizontal deflection circuit 21 is transferred by means of a flyback or horizontal output transformer 22 to an output terminal 66 at the junction of an SSVD storage capacitor $C_s$ and a vertical deflection winding $L_v$. The horizontal rate energy 65 is coupled from a primary winding 22a of flyback transformer 22 to secondary windings 22b and 22c. Winding 22b is series coupled with output terminal 66 in a first path including first a switch, SCR 23, and a first impedance comprising an inductor 63. Winding 22c is series coupled with output terminal 66 in a second path including a second switch, SCR 24, and a second impedance comprising an inductor 64. Conventionally, inductors 63 and 64 are equally valued.

To generate a sawtooth vertical deflection current $i_v$ in the vertical deflection winding $L_v$, the amount of energy transferred is varied by varying the conduction angles of SCR 23 and SCR 24 within each horizontal deflection cycle by means of control signals coupled to the gates of SCR 23 and SCR 24 from a modulator 25. For a positive going sawtooth vertical deflection current $i_v$ illustrated in FIG. 1, SCR 24 conducts for a longer interval during each horizontal deflection cycle for the first portion of the vertical trace interval $T_v$, whereas SCR 23 conducts for a longer interval for the latter portion of the vertical trace interval.

Synchronization of SCR conduction within each horizontal deflection cycle is achieved illustratively by coupling horizontal retrace pulses 51 from a flyback transformer winding 22d to modulator 25. Vertical retrace is initiated by coupling vertical sync signals 26 to modulator 25. The resultant vertical sawtooth deflection current $i_v$ flowing through winding $L_v$ is linearly maintained by coupling a feedback voltage $V_f$ developed across a feedback resistor $R_s$ to modulator 25. Nonlinear effects such as "S" shaping correction have been omitted from the discussion.

The horizontal deflection circuit 21 provides a source of energy to various load circuits such as a high voltage circuit 27 as well as SSVD 20 coupled to a flyback transformer winding 22d. As mentioned previously, the loading by SSVD 20 is not at a uniform rate throughout the vertical trace interval but varies parabolically. At the top and bottom of vertical scan a relatively large amount of energy is supplied by the horizontal deflection circuit 21 and a minimum is supplied near the center.

The horizontal amplitude $I_H$ or the peak to peak horizntal trace current will vary with this vertical loading, the amplitude also varying in a parabolic manner. Such amplitude variation will provide much or all of the needed East-West (E-W) pincushion correction required to compensate for pincushion distortion. Further pincushion correction as needed may be provided by E-W pincushion correction circuits, not shown in FIG. 1, such as disclosed in U.S. Pat. No. 4,088,931 by P. E. Haferl, entitled "PINCUSHION CORRECTION CIRCUIT".

Figure 3A:
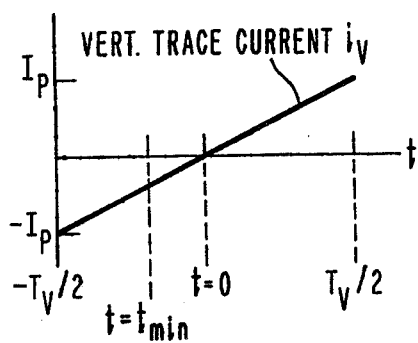
FIGS. 2–8 illustrate raster representations and waveforms associated with the circuit of FIG. 1.
Figure 2:
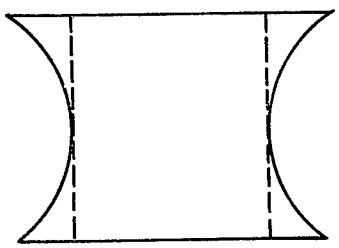
Figure 3B:
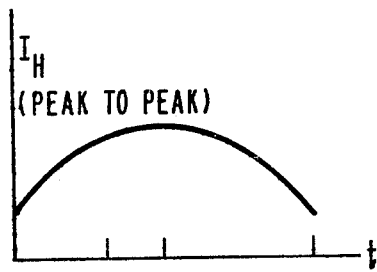

As illustrated by the solid line raster of FIG. 2, E-W distortion produces an approximately parabolic variation of the vertical sides of the raster. During vertical scan, from time $-T_V/2$ to $+T_V/2$ of the vertical trace current $i_v$ illustrated in FIG. 3a, the peak to peak horizontal trace current $I_H$ varies in an approximately parabolic manner at a vertical rate as illustrated in FIG. 3b. A minimum amplitude occurs at the top and bottom of the raster and a maximum at the center. A relatively straight vertical side of the raster is produced correcting for E-W raster distortion, as illustrated by the dashed vertical lines of FIG. 2.

To compensate correctly for E-W distortion, the vertical rate parabolic amplitude variations of the horizontal trace current must be symmetrical with respect to the center of vertical trace. Without additional circuitry embodying a feature of the invention, the SSVD circuit, although presenting a vertical rate parabolic load to the horizontal deflection circuit, will not present a load that is symmetrical with respect to the center of vertical trace.

The instantaneous power $P_v$ flowing in the SSVD circuit 20 includes two components. A dissipative component comprises $i_v^2R$ where R equals the sum of the yoke resistance $R_y$ and the feedback resistance $R_s$, and $i_v$ equals the vertical deflection current. The second component comprises a nondissipative reactive component $L_v i_v di_v/dt$ associated with the vertical deflection winding inductance $L_v$. The energy stored in the inductance $L_v$ is $\frac{1}{2}L_v i_v^2$ and is maximum at the top and bottom of the raster where the vertical deflection current magnitude is at a maximum and is minimum at the center.

Figure 3C:
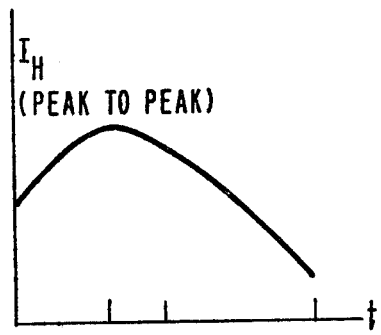

Thus, during the first half of vertical scan, the vertical deflection winding inductance $L_v$ itself contributes part of the energy required by the resistive dissipation component due to the release of energy stored in the winding at the beginning of the trace interval. Correspondingly, the horizontal deflection circuit need contribute only a lesser amount of energy during this interval. During the second half of vertical scan, with the vertical deflection winding current of opposite polarity but of increasing magnitude, the horizontal deflection circuit must contribute energy both for resistive dissipation in the winding resistance and feedback resistor $R_s$ and for storing magnetic field energy in the winding inductance $L_v$. The loading of the horizontal deflection circuit by the SSVD circuit is no longer symmetrical but is less during the first half of vertical scan and greater during the second half. The horizontal deflection current amplitude $I_H$ varies at an asymmetrically positioned vertical parabolic rate with respect to the center of the vertical trace interval as illustrated in FIG. 3c. Side raster distortion, which is a function of the peak horizontal scanning current, will therefore be asymmetric.

Figure 4:
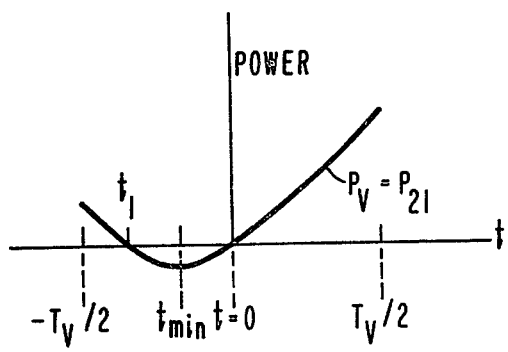

The instantaneous power flowing in vertical deflection winding $L_v$ and feedback resistor $R_S$ is illustrated in FIG. 4 and may be computed using the following equations:

$$P_v = L_v i_v di_v/dt + Ri_v^2 = R(i_v + \frac{L_v}{2R} di_v/dt)^2 - \frac{L_v^2}{4R}(di_v/dt)^2 \quad (1)$$

For a linear vertical deflection current with a peak vertical trace current of $I_p$, equation (1) reduces to the parabolically varying equation:

$$P_v = 4RI_p^2/T_v^2 (t + L_v/2R)^2 - L_v^2 I_p^2/RT_v^2 \quad (2)$$

Equation 2 is illustrated by the curve of FIG. 4 which comprises a parabolically varying power flow curve asymmetrically located with respect to the center of the vertical trace interval, the line of symmetry being $t = t_{min} = -L_v/2R$.

The horizontal deflection circuit must supply a load power $P_{21} = P_v$. Thus, at the top of the raster, at time $-T_v/2$, horizontal deflection circuit 21 must supply less load power than it supplies at the bottom of the raster at time $+T_v/2$.

Figure 5:
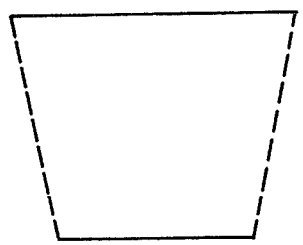

This asymmetry results in a corresponding asymmetrical positioning of the vertical rate parabolically varying peak to peak horizontal deflection current amplitude $I_H$ as illustrated in FIG. 3c. A larger amplitude horizontal deflection current is provided at the top of the raster than at the bottom, resulting in an incomplete E−W correction and an introduction of a substantially keystone-like distortion to the desired vertical sides of the raster, as illustrated by the dashed lines in FIG. 5.

It should be noted that although the curve of FIG. 4 indicates a negative power flow between times $t = t_1$ and $t = 0$, no energy actually flows back to the horizontal deflection circuit for typical SSVD circuits. In deriving equations 1 and 2, other resistive losses in the SSVD circuit components, such as in the SCR switches 23 and 24 and storage capacitor $C_S$, have been ignored. Also ignored has been the effect of nonlinearities such as "S" shaping correction on the power flow waveform of FIG. 4.

To eliminate distortions such as keystone distortion produced by the vertical rate loading of SSVD circuit 20 or the horizontal deflection circuit 21, a feature of the invention provides for coupling a second source of energy other than that of the horizontal deflection circuit to the vertical deflection circuit. Resistors 28–30 and transistor 31 for a current source 33 providing illustratively a constant correction current $+I_k$ to vertical deflection winding $L_v$. Diode 32 prevents reverse conduction through transistor 31 during vertical retrace.

Figure 6:
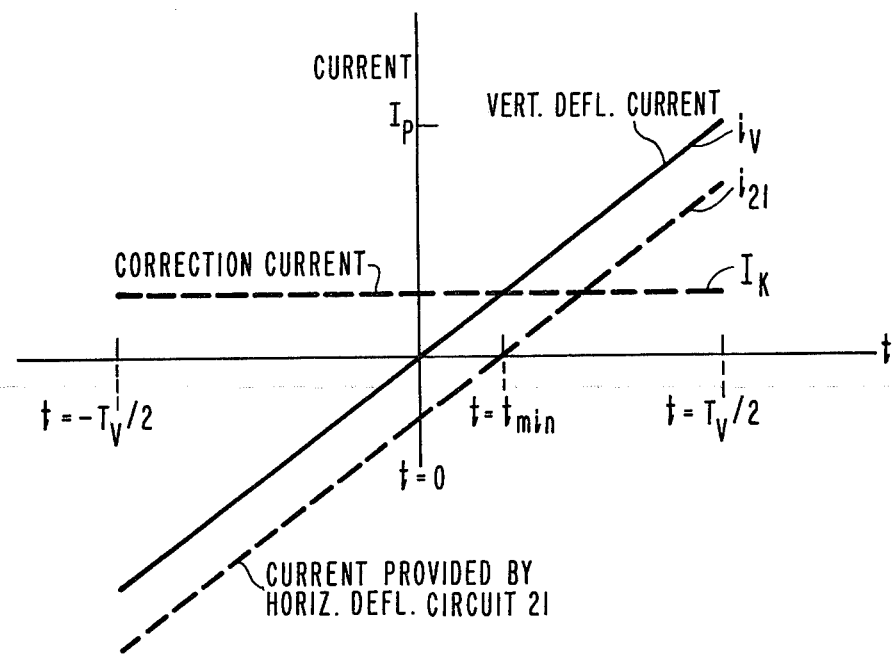

As illustrated in FIG. 6, the vertical trace current, neglecting "S" correction, is maintained as a linear sawtooth current by the feedback voltage $V_f$ coupled to modulator 25. Modulator 25 then varies the conduction times of SCR 23 and 24 accordingly. A component of this linear sawtooth current $i_v$ comprises the constant correction current $+I_k$. The other component $i_{21}$ as illustrated in FIG. 6 must then be supplied by horizontal deflection circuit 21.

Figure 7:
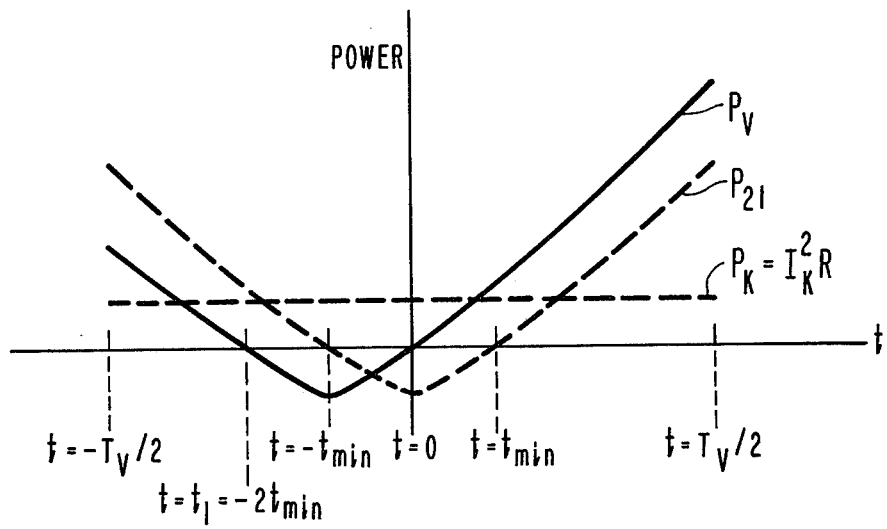

As illustrated in FIG. 7, $P_v$, the power flowing through vertical deflection winding $L_v$ and feedback resistor $R_s$ is no longer supplied solely by horizontal deflection circuit 21. Instead $P_v = P_{21} + P_k$, $P_k$ being the power supplied by current source 33. The magnitude of the correction current $I_k$ is selected to position the minimum value of the parabolic power curve $P_{21}$ to the time $t = 0$, thereby making the parabolic loading $P_{21}$ of horizontal deflection circuit 21 by the SSVD circuit 20 symmetrical. The horizontal deflection current amplitude $I_H$ now varies symmetrically at a parabolic vertical rate as illustrated in FIG. 3b, producing relatively complete E-W raster correction without substantial side distortions such as keystone-like distortion.

Correction current $+I_k$ may be considered as aiding the horizontal deflection circuit in the supply of vertical deflection current during the second half of vertical trace and subtracting from the supply during the first half. Thus, horizontal deflection circuit 21 must provide more of the vertical deflection current during the first half of vertical trace and less during much of the second half. This type of compensatory asymmetrical loading is of a direction opposite that of the first discussed asymmetrical loading caused by the generation and collapse of the stored magnetic field energy in the vertical deflection winding $L_v$. The combined effect of the two asymmetrical loadings is to produce the desired symmetrical loading of the horizontal deflection circuit 21.

One may approximately determine the amount of correction current $+I_k$ required by assuming a linear sawtooth vertical deflection current $i_v$ and differentiating equation (1) with respect to $i_v$ and then equating the resultant terms to zero; i.e., let $dp_v/di_v = 0$. From the above, one determines that $$i_{vmin} = \frac{-L_v}{2R} \frac{di_v}{dt} = \frac{-L_v I_p}{RT_v}.$$

Thus $P_{vmin}$ does not occur at the center of vertical trace whereby $i_v$ equals zero. To shift the parabola in phase to where $i_{vmin}$ does equal zero, and thereby to symmetrize the parabola with respect to the center of vertical trace, a constant current $I_k = -i_{vmin} = L_v I_p / RT_v$ is introduced by current source 33.

Figure 8:
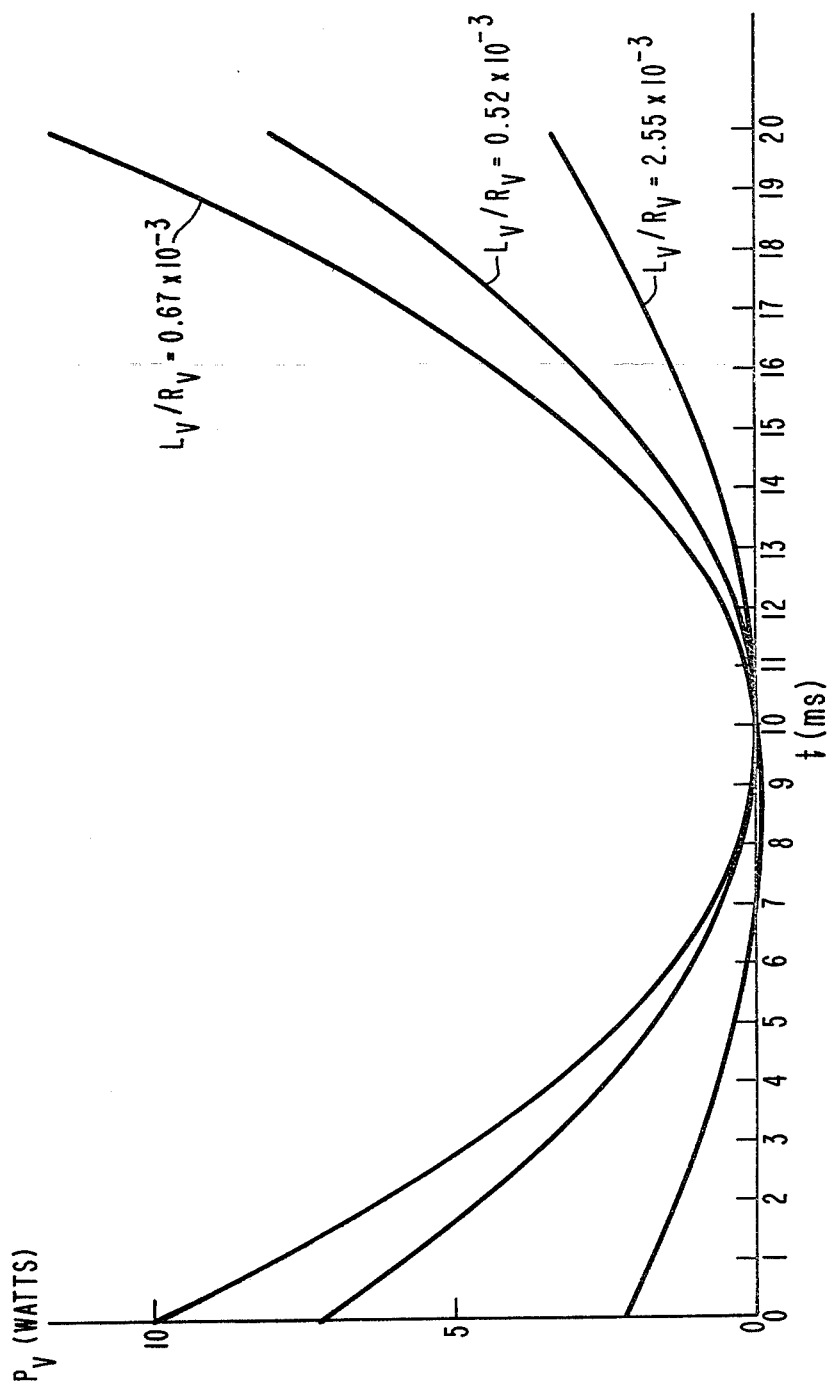

Such keystone-like distortions are particularly noted in deflection yokes with large $L_v/R_v$ ratios. In FIG. 8, the instantaneous power $P_v$ is shown for three picture tubes with three different $L_v/R_v$ ratio yokes. The asymmetry of the parabolas of FIG. 8 is an indication of the amount of keystone distortion present.

Another effect of asymmetrical loading is that the gain for many SSVD deflection circuits will be asymmetrical since the gain for many of those circuits is dependent on the amplitude and width of the horizontal retrace pulses. With asymmetrical loading, the horizontal retrace pulses occurring during the first half of vertical scan are different than those occurring during the second half of vertical scan. Vertical nonlinearity results. When the loading is made symmetrical, this nonlinearity is substantially removed.

FIG. 1 illustratively shows an SCR horizontal deflection circuit 21 similar to the one disclosed in U.S. Pat. No. 3,452,244 by W. F. W. Dietz, entitled "ELECTRON BEAM DEFLECTION AND HIGH VOLTAGE GENERATION CIRCUIT." Horizontal deflection circuit 21 includes an input choke 52, trace and commutating switches 53 and 54, a commutating circuit comprising inductor 56 and capacitors 57–59, and horizontal deflection winding 60, a first DC blocking capacitor 61, primary winding 22a, and a second DC blocking capacitor 62. The principles of the invention however may be followed when using other horizontal deflection circuits such as transistorized horizontal deflection circuits. Other vertical deflection circuits may also be used where the vertical deflection circuit represents a vertical rate loading of the horizontal deflection circuit and provides a direct loading or has a direct effect on the amplitude of the horizontal deflection current.

As mentioned previously, the origin of the keystone-like raster distortion may be ascribed to asymmetrical loading of horizontal deflection circuit 21 within the vertical trace interval. During the first portion of vertical trace when the vertical deflection winding $L_v$ magnetic field is collapsing and when SCR 24 conducts for a longer period within each horizontal deflection cycle, lesser loading of horizontal deflection circuit 21 occurs. During the latter portion of vertical trace when SCR 23 conducts longer, greater loading occurs. A compensatory asymmetrical loading is provided by constant current source 33 for symmetrizing the power curve $P_{21}$ of horizontal deflection circuit 21 and thereby substantially reduce the keystone-like distortion, as illustrated in FIG. 7. The correct compensatory loading is that provided by a constant current $I_k$.

Figure 9:
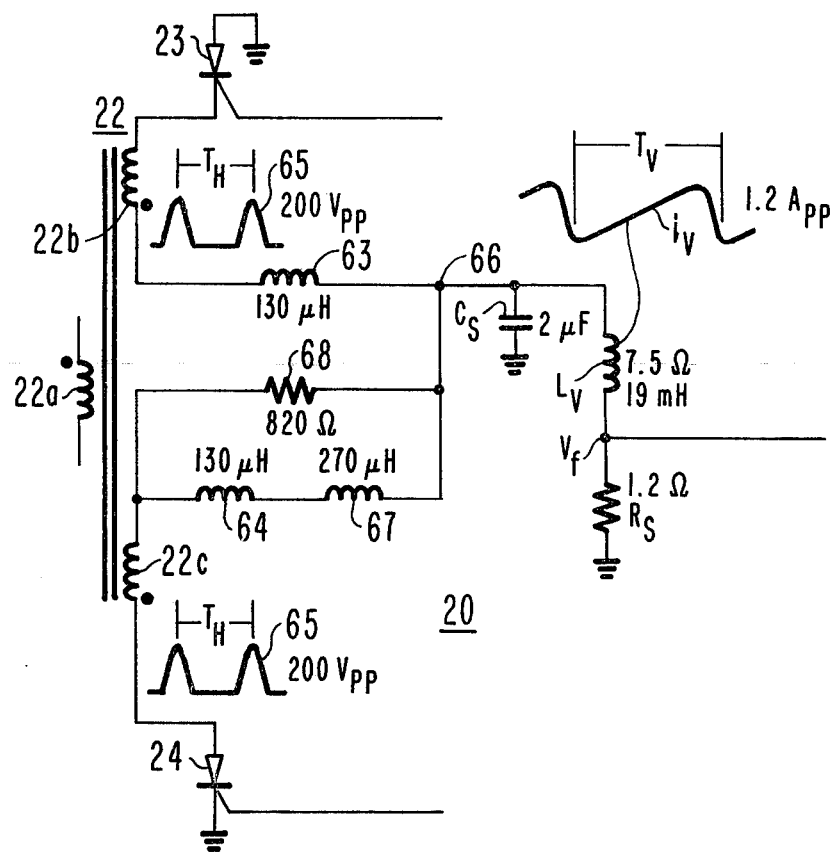
FIG. 9 illustrates other deflection circuitry embodying the invention.

For some picture tubes with relatively small $L_v/R_v$ ratios, relatively small picture tube screen sizes, and relatively little East-West pincushion error, compensatory asymmetrical loading of horizontal deflection circuit 21 by means other than that of current source 33 may provide acceptable though not exact correction. As illustrated in FIG. 9, an additional impedance 67, illustratively an inductor, is provided in the series current path of SCR 24. A larger impedance in the current path of SCR 24 requires a longer conduction time for SCR 24 during the first portion of vertical trace. This increased impedance in series with SCR 24 provides an increased loading of horizontal deflection circuit 21 during the first portion of vertical trace and compensates somewhat for the decreased loading during this portion caused by the collapse of vertical winding $L_v$ magnetic field. If impedance 67 is an inductor, inductors 64 and 67 may be combined into a single element with a total inductance value greater than inductor 63. A resistor 68 is coupled across inductors 64 and 67 for transient damping.

Although the compensating circuit embodiment illustrated in FIG. 9 do not provide the ideal correction that the constant current source 33 of FIG. 8 provides, this circuit may provide adequate correction when relatively small errors are involved.

What is claimed is:

1. A raster distortion correction circuit, comprising:
   a horizontal deflection circuit;
   a vertical deflection circuit including a vertical deflection winding within which winding a vertical scanning current is developed;
   energy transfer means coupled to said horizontal and vertical deflection circuits for obtaining energy for said vertical deflection circuit from said horizontal deflection circuit, said vertical deflection winding tending to cause an undesired decrease in the loading of said horizontal deflection circuit during a top portion of the raster scan and tending to cause an undesired increase in the loading of said horizontal deflection circuit during a bottom portion of the raster scan; and
   correction means within said vertical deflection circuit for opposing said undesired decrease in the loading of said horizontal deflection circuit during said top portion and for opposing said undesired increase in the loading of said horizontal deflection circuit during said bottom portion for correcting raster distortion otherwise introduced by the asymmetrical loading tendency of said vertical deflection winding.

2. A circuit according to claim 1, wherein said energy transfer means comprises a flyback transformer and said vertical deflection circuit comprises a switched vertical deflection circuit including first and second switches coupled to said flyback transformer and said vertical deflection winding, and responsive to horizontal rate control signals, the conduction angles of said first and second switches varied by said control signals within each horizontal deflection cycle in a manner to produce said vertical rate scanning current.

3. A circuit according to claim 1 or 2 wherein said raster distortion comprises a keystone-like distortion.

4. A circuit according to claims 1 or 2 wherein said correction means comprises a current source coupled to said vertical deflection winding.

5. A circuit according to claim 4 wherein said current source produces a constant current approximately equal to $I_K$, where $I_K = L_v I_p / RT_v$, where $L_v$ equals the vertical deflection winding inductance, $I_p$ equals the peak vertical trace current, R equals the total resistance in series with the vertical deflection winding, and $T_v$ equals the vertical scan interval.

6. A raster distortion correction circuit comprising:
   a horizontal deflection circuit;
   energy transfer means coupled to said horizontal deflection circuit, said energy transfer means including a flyback transformer;

a switched vertical deflection circuit coupled to said energy transfer means and obtaining energy from said horizontal deflection circuit and including first and second switches coupled to said flyback transformer and to a vertical deflection winding, said first and second switches responsive to horizontal rate control signals for varying the conduction angles of said first and second switches within each horizontal deflection cycle in a manner producing vertical rate scanning current in said vertical deflection winding, said vertical deflection circuit producing a first asymmetrical vertical rate loading of said horizontal deflection circuit; and correction means comprising first and second series impedances coupled to said first and second switches respectively, the impedance coupled to that one of said first and second switches which conducts longer during the beginning portion of the vertical trace being of greater magnitude than the impedance coupled to the other one of said first and second switches for producing a compensatory asymmetrical vertical rate loading of said horizontal deflection circuit for substantially reducing raster distortion caused by said first asymmetrical vertical rate loading.

* * * * *